United States Patent
Tan et al.

(10) Patent No.: US 8,487,581 B2
(45) Date of Patent: Jul. 16, 2013

(54) BATTERY PACK BURN-IN TEST SYSTEM AND METHOD

(75) Inventors: Eng Soon Dave Tan, Singapore (SG); Shih-Fa Hung, Kaohsiung County (TW); Chit Tee Tan, Singapore (SG)

(73) Assignee: STL Energy Technology (S) PTE Ltd., Singapore (SG)

( * ) Notice: Subject to any disclaimer, the term of this patent is extended or adjusted under 35 U.S.C. 154(b) by 255 days.

(21) Appl. No.: 13/063,503

(22) PCT Filed: Sep. 17, 2008

(86) PCT No.: PCT/SG2008/000352
§ 371 (c)(1), (2), (4) Date: May 31, 2011

(87) PCT Pub. No.: WO2010/033076
PCT Pub. Date: Mar. 25, 2010

(65) Prior Publication Data
US 2012/0126820 A1 May 24, 2012

(51) Int. Cl.
*H02J 7/00* (2006.01)
(52) U.S. Cl.
USPC ......................................................... 320/103
(58) Field of Classification Search
USPC ................................. 324/434; 320/103, 164
See application file for complete search history.

(56) References Cited

U.S. PATENT DOCUMENTS

| | | | |
|---|---|---|---|
| 4,398,346 A * | 8/1983 | Underhill et al. | 29/623.5 |
| 5,049,803 A * | 9/1991 | Palanisamy | 320/132 |
| 5,160,880 A | 11/1992 | Palanisamy | |
| 6,274,265 B1 * | 8/2001 | Kraska et al. | 429/90 |
| 6,380,712 B2 | 4/2002 | Murphy et al. | |
| 7,508,162 B2 * | 3/2009 | Lippojoki et al. | 320/103 |
| 7,863,856 B2 * | 1/2011 | Sherman et al. | 320/103 |
| 8,047,316 B2 * | 11/2011 | Takami et al. | 180/65.29 |
| 2005/0151513 A1 | 7/2005 | Cook et al. | |
| 2007/0284159 A1 | 12/2007 | Takami et al. | |
| 2008/0042493 A1 | 2/2008 | Jacobs | |

FOREIGN PATENT DOCUMENTS

| | | |
|---|---|---|
| EP | 1921705 A2 | 5/2008 |
| WO | WO-92/22822 A1 | 12/1992 |
| WO | WO-2005086315 A1 | 9/2005 |

\* cited by examiner

*Primary Examiner* — Ramy Ramadan
(74) *Attorney, Agent, or Firm* — Fulbright & Jaworski LLP (57) ABSTRACT

A battery pack burn-in test system comprising first and second interconnection circuits for electrically interconnecting a first and a second battery pack respectively to the system; a data communication bus for coupling to respective battery management integrated circuits (ICs) of the first and second battery packs; and a system management unit coupled to the data communication bus. The system management unit may control a charging of the first battery pack during a burn-in test from a discharging of the second battery pack.

14 Claims, 9 Drawing Sheets

BATTERY PACK BURN-IN TEST SYSTEM AND METHOD

CROSS-REFERENCE TO RELATED APPLICATIONS

This application is a national stage application of PCT/SG2008/000352 filed Sep. 17, 2008.

TECHNICAL FIELD

The present invention relates broadly to a battery pack burn-in test system and method.

BACKGROUND OF THE INVENTION

Presently, many portable devices such as cordless power tools, computer notebooks and mobile phones are shipped with a lithium-ion battery pack due to its advantages of high energy density, low self-discharge, no memory effect, longer run-time and light-weight compared to a conventional battery pack. However, lithium-ion battery packs may result in unsafe operation due to over-charging, over-discharging or over-heating conditions.

A lithium-ion battery pack is typically made up of one or a plurality of lithium-ion cells either in series or in parallel connection, depending on its output energy requirements. The battery pack also comprises a protection board for monitoring and ensuring that the lithium-ion cells operate within their safety limits. Some battery packs include fuel gauge integrated circuit (IC) to estimate the state of charge (SOC) and are also able to communicate with external devices via System Management Bus (SMBus) communication. This type of battery pack is commonly known as a Smart Battery Pack.

As part of the manufacturing process, battery pack manufacturers typically perform a battery pack burn-in test using a 3-phase cycle of full charging-full discharging-50% charging of each battery pack to weed out any initial faulty battery packs due to component defects, mismatched cells, poor spot-welding, poor solder joint and other functional defects. At the same time, the battery pack also performs a SOC calibration to accurately update its SOC during the full charging-full discharging cycle.

The battery pack burn-in test system is a relatively sophisticated electronic test system which supports multi-channel testing, user programmable burn-in test parameters and test data logging functions. The devices which provide the transfer of energy to and from the battery packs are the Constant Current Constant Voltage (CCCV) Charger and the Electronic Load (ELoad) respectively. During the discharge phase, the battery pack to be tested, here referred to as the Pack-Under-Test (PUT), is connected to an ELoad which discharges the PUT with a preset current. The PUT will terminate the discharging process when any of its cells goes below the over-discharge voltage threshold. In the charge phase, the PUT is connected to a CCCV Charger where the charger will terminate the charging process when the PUT's full-charge conditions are met. The burn-in test cycle typically begins with charging and the PUT will first be charged from an initial capacity of about 50% to a full-charge capacity of 100%. The PUT will then be completely discharged to 0%. Finally, the PUT is recharged to its shipping capacity of 50%. The initial capacity of the PUT is about 50% as this is the initial shipping capacity of the lithium-ion cells. Accordingly, the battery pack manufacturers have to recharge the PUT to 50% prior to shipment. The duration of the burn-in test cycle depends on the setting of the charging and discharging currents. More heat will be generated for a shorter burn-in period due to higher current requirements and vice versa. Typically, the burn-in test duration ranges from 3 hours to 5 hours.

The present method of battery pack burn-in test process has a problem of generating large amount of heat as the PUT exchanges energy between the ELoad and the CCCV charger. As an example, a standard 6-cell lithium-ion battery pack that is designed for a computer notebook typically dissipates around 35 W in the form of heat during the discharge phase. Consequently, a thousand PUTs discharging at the same time will result in 35 kW of power being converted into waste heat. It is relatively common for a battery pack manufacturing site to maintain burn-in processes of thousands of battery packs simultaneously. With such a large amount of heat generated as a result of the burn-in processes, it is a very costly operation to control the temperature of the burn-in process room to an acceptable operating temperature. Powerful air-conditioners and heat removal system may help to cool down the room but these consume additional electricity which can result in higher costs. Furthermore, failure to control the temperature of the burn-in process room may result in safety concerns as the lithium-ion battery packs may be operating outside their safety operating zone.

A need therefore exists to provide a battery pack burn-in test system and method that seek to address at least one of the abovementioned problems.

BRIEF SUMMARY OF THE INVENTION

According to a first aspect of the present invention there is provided a battery pack burn-in test system comprising first and second interconnection circuits for electrically interconnecting a first and a second battery pack respectively to the system; a data communication bus for coupling to respective battery management integrated circuits (ICs) of the first and second battery packs; and a system management unit coupled to the data communication bus. The system management unit may control a charging of the first battery pack during a burn-in test from a discharging of the second battery pack.

The system may further comprise a current limiter coupled to the data communication bus, the current limiter being electrically connected between the first and second battery pack to limit a charging current for charging the first battery pack from the discharging of the second pack for an initial charging of the first battery pack in a constant current charging state under the control of the system management unit.

The system may further comprise a first adjustable power supply electrically connected in series with the second electrical interconnection circuit and coupled to the data communication bus for maintaining a selected voltage difference between a series voltage of the second battery pack and the first adjustable power supply on the one hand, and a voltage of the first battery pack on the other hand under the control of the system management unit.

The system management unit may further maintain the series voltage of the second battery pack and the first adjustable power supply at a constant value and may allow the charging current to gradually decrease in a constant voltage charging state following the constant current charging state.

The system may further comprise a second adjustable power supply electrically connected in series with the first electrical interconnection circuit and coupled to the data communication bus for maintaining a selected voltage difference between a series voltage of the first battery pack and the second adjustable power supply on the one hand, and a voltage of the second battery pack on the other hand under the control of the system management unit during a constant current charging state of the second battery pack from a discharging of the first battery pack; and the system management unit may further maintain the series voltage of the first battery pack and the second adjustable power supply at a constant value and may allow the charging current to gradually decrease in a constant voltage charging state of the second battery pack following the constant current charging state of the second battery pack.

The system may further comprise first and second chargers electrically connected in parallel with the first and second interconnections respectively and coupled to the data communication bus, for auxiliary charging of the first and second battery packs under the control of the system management unit.

The system may further comprise first and second electronic loads electrically connected in parallel with the first and second interconnection circuits respectively and coupled to the data communication bus, for auxiliary discharging of the first and second battery packs under the control of the system management unit.

The system may further comprise a power switch electrically connected in series between the first and second interconnection circuits and coupled to the data communication bus, for disconnecting a series connection between the first and second battery packs during the auxiliary charging or discharging.

The system management unit may determine potential differences and temperatures of the first and the second battery packs respectively.

The system management unit may determine charge capacities of the first and the second battery packs respectively.

The system management unit may comprise a microcontroller.

The data communication bus may comprise a SMBus.

According to a second aspect of the present invention there is provided a method for burn-in testing of battery packs, the method comprising charging a first battery pack from a discharging of a second battery pack.

The method may further comprise limiting a charging current for charging the first battery pack from the discharging of the second pack for an initial charging of the first battery pack in a constant current charging state.

The method may further comprise providing an adjustable power supply in series with the second battery pack and maintaining a selected voltage difference between a series voltage of the second battery pack and the first adjustable power supply on the one hand, and a voltage of the first battery pack on the other hand.

The method may further comprise maintaining the series voltage of the second battery pack and the first adjustable power supply at a constant value and allowing the charging current to gradually decrease in a constant voltage charging state following the constant current charging state.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION OF THE INVENTION

The example embodiments described hereafter may be able to overcome the shortcomings that have been described previously. The example embodiments may provide a battery pack burn-in test system and a method of transferring energy between battery packs. The transfer of energy between battery packs occurs via the use of the discharge of a first battery pack in the discharging state during the burn-in test to charge a second battery pack in the charging state. In example embodiments, the transfer of energy may be a unidirectional process from the first battery pack to the second battery pack. In alternate embodiments, the transfer of energy may be a bi-directional process involving the transfer of energy from the first battery pack to the second battery pack and vice versa.

Figure 1:
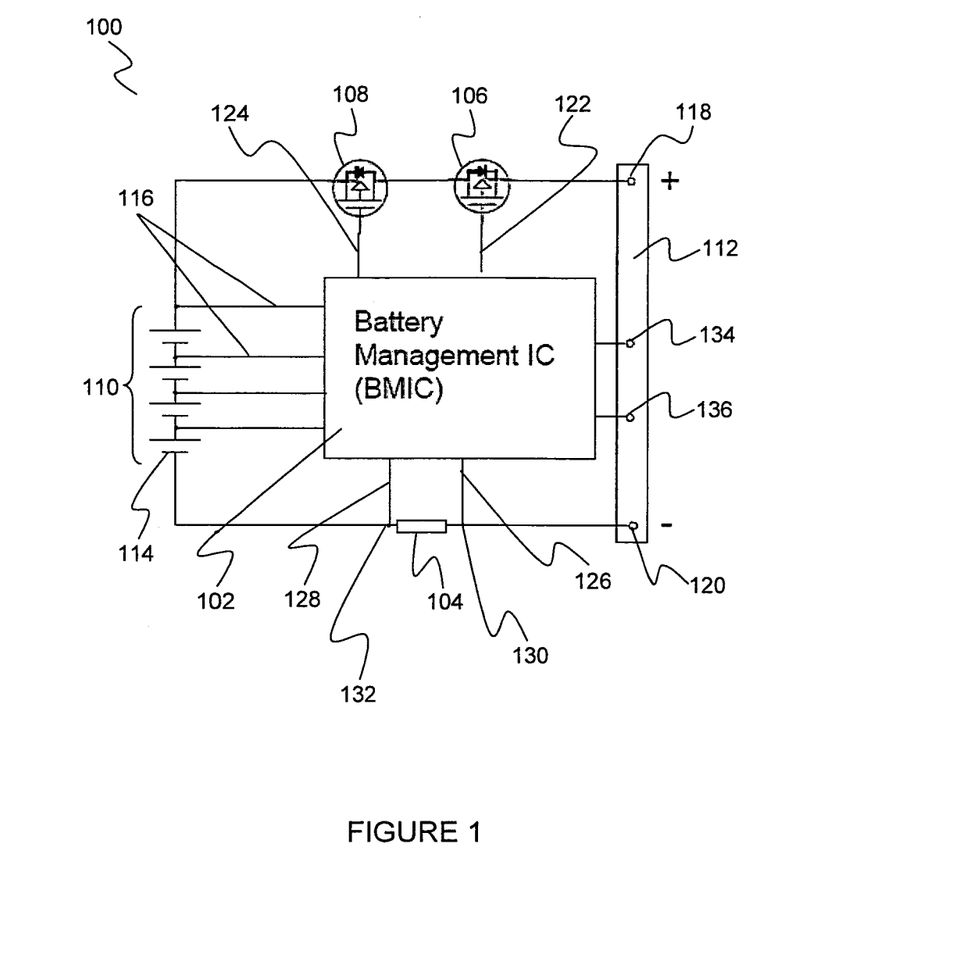
FIG. 1 shows a schematic block diagram illustrating the functional blocks for a lithium-ion battery pack in accordance with one embodiment of the present invention.

FIG. 1 shows a schematic block diagram illustrating the functional blocks for a lithium-ion battery pack 100 in accordance with one embodiment of the present invention. The lithium-ion battery pack 100 comprises a Battery Management IC (BMIC) 102, a Sense Resistor (RS1) 104, a P-channel Charge MOSFET (CFET) 106, a P-channel Discharge MOSFET (DFET) 108, a Rechargeable Battery 110 and a connector (CN1) 112. In example embodiments, Battery Management IC (BMIC) 102 may be a microcontroller.

The Rechargeable Battery 110 in accordance with embodiments of the present invention comprises one or more individual cells e.g. 114 arranged in series. It should be appreciated that the individual cells e.g. 114 can be arranged in series or in parallel in any configurations depending on the output energy requirements. In example embodiments, the P-channel Charge MOSFET (CFET) 106 is connected in series with the P-channel Discharge MOSFET (DFET) 108 between the positive electrode of the Rechargeable Battery 110 and the positive (+) terminal 118 of the battery pack 100. The P-channel Charge MOSFET (CFET) 106 and the P-channel Discharge MOSFET (DFET) 108 are connected to the Battery Management IC (BMIC) 102 via corresponding electrical connection represented as lines 122 and 124 respectively. The battery pack 100 further comprises a Sense Resistor (RS1) 104 arranged between the negative electrode of the Rechargeable Battery 110 and the negative (−) terminal 120 of the battery pack 100. It should be appreciated that the P-channel Charge MOSFET (CFET) 106, the P-channel Discharge MOSFET (DFET) 108 and the Sense Resistor (RS1) 104 may be arranged in other configurations without departing from the spirit or scope of the invention as broadly described.

The Rechargeable Battery 110 comprising individual cells e.g. 114 of example embodiments are connected to the Battery Management IC (BMIC) 102 via corresponding electrical connection represented as lines e.g. 116. The Battery Management IC (BMIC) 102 monitors the voltages and temperatures of the individual cells e.g. 114 of the Rechargeable Battery 110 to ensure that the cells e.g. 114 are operating within their safety limits. The cells e.g. 114 may be charged by an external Constant Current Constant Voltage (CCCV) charger (not shown) by connecting the corresponding terminals of the CCCV charger to the positive (+) terminal 118 and the negative (−) terminal 120 provided on the Connector (CN1) 112 of the battery pack 100. If any of the cells e.g. 114 is charged beyond a pre-determined over-charge voltage protection threshold or is operating outside a pre-determined safe charge temperature range, the Battery Management IC (BMIC) 102 will turn off the P-channel Charge MOSFET (CFET) 106 to disable charging, thus protecting the cells e.g. 114 from being over-charged or operating at a relatively unsafe temperature level. Typically, the over-charge voltage protection threshold for a lithium-ion cell is about 4.2 V.

The cells e.g. 114 of the battery pack 100 in example embodiments may be discharged by an external device load (not shown) by connecting the corresponding terminals of the device load to the positive (+) terminal 118 and the negative (−) terminal 120 provided on the Connector (CN1) 112 of the battery pack 100. If any of the cells e.g. 114 is discharged below a pre-determined over-discharge voltage protection threshold or is operating outside a pre-determined safe discharge temperature range, the Battery Management IC (BMIC) 102 will turn off the P-channel Discharge MOSFET (DFET) 108 to disable discharging, thus protecting the cells e.g. 114 from being over-discharged or operating at a relatively unsafe temperature level. Typically, the over-discharge voltage threshold for a lithium-ion cell is about 2.5 V.

In example embodiments, the Battery Management IC (BMIC) 102 additionally monitors the current flow in the battery pack 100 by detecting the potential difference, also referred to as voltage drop, across the Sense Resistor (RS1) 104 via corresponding electrical connection represented as lines 126 and 128 connected at junctions 130 and 132 respectively. If the charge current or discharge current exceeds their respective pre-determined current thresholds, the Battery Management IC (BMIC) 102 will turn off the P-channel Charge MOSFET (CFET) 106 or the P-channel Discharge MOSFET (DFET) 108 to disable charging or discharging respectively. The Battery Management IC (BMIC) 102 according to embodiments of the present invention can additionally detect the status of the battery pack 100 and communicate this information to an external device using System Management Bus (SMBus) protocol via the SMBus CLK 134 and the SMBus DAT 136 terminals provided on the Connector (CN1) 112 of the battery pack 100.

Figure 2:
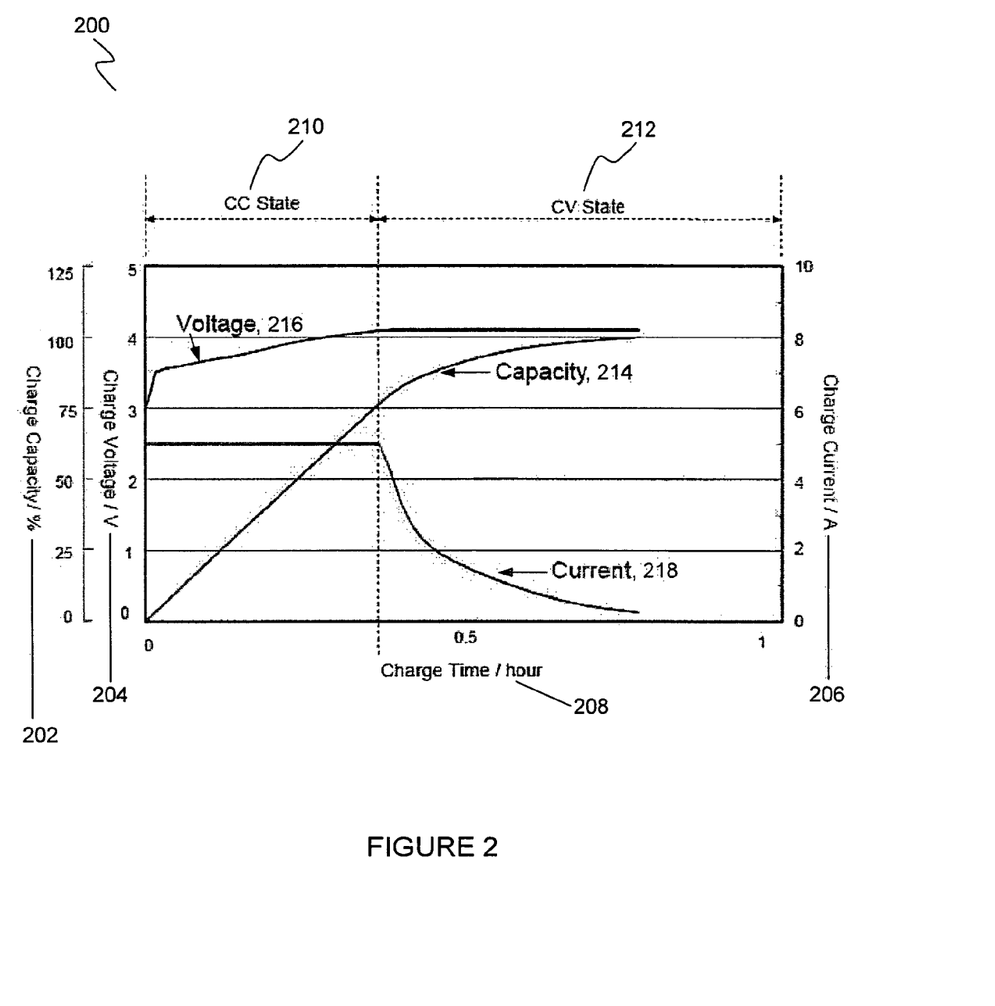
FIG. 2 illustrates a Constant Current Constant Voltage (CCCV) charging profile of a lithium-ion cell in a lithium-ion battery pack in accordance with one embodiment of the present invention.

FIG. 2 illustrates a Constant Current Constant Voltage (CCCV) charging profile 200 of a lithium-ion cell in accordance with one embodiment of the present invention. The Constant Current Constant Voltage (CCCV) charging profile 200 shows the characteristics of the charge capacity 202, the charge voltage 204 and the charge current 206 against the charge time 208. During the Constant Current (CC) state 210, the lithium-ion cell is charged with a pre-determined constant current, represented by the current curve 218, until the cell reaches about 75% of its full capacity as shown by the capacity curve 214. In this Constant Current (CC) state 210, the charge voltage during charging of the cell increases as shown by the voltage curve 216. At the point of 75% full capacity, the voltage of the cell and the voltage drop across the internal resistance of the cell are equal to the maximum output voltage of the charger. The charging state then switches from the Constant Current (CC) state 210 to the Constant Voltage (CV) state 212 where the cell is now charged with a constant voltage as shown by the voltage curve 216. As the cell gains in potential, the voltage difference across its internal resistance and the charge current 206 will reduce gradually until the charge current 206, represented by the current curve 218, falls below a pre-determined level which is generally set at about 5% to 10% of the CC current setting. This condition signals that the cell is now fully charged and the CCCV Charger turns off its output to stop the charging process.

Figure 3:
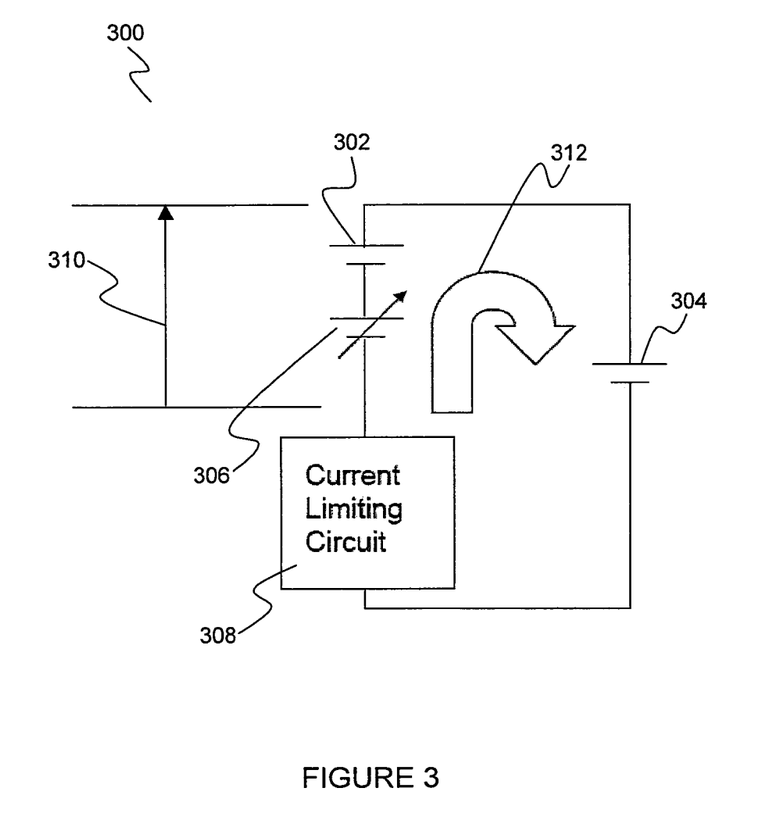
FIG. 3 shows a schematic block diagram illustrating a manual energy transfer process between two lithium-ion battery packs of an example embodiment.

FIG. 3 shows a schematic block diagram illustrating a manual energy transfer process 300 between two lithium-ion battery packs of example embodiments of the present invention. The process 300 transfers energy from the Battery Pack A 302 to the Battery Pack B 304. The Battery Pack A 302 is connected in series with a Variable Power Supply (VPS1) 306 and a Current Limiting Circuit (CL1) 308. The Battery Pack B 304 is connected in parallel to the Battery Pack A 302, the Variable Power Supply (VPS1) 306 and the Current Limiting Circuit (CL1) 308. The transfer of energy from the Battery Pack A 302 to the Battery Pack B 304 can be controlled by changing the level of the Total Series Voltage (TSV) 310, determined collectively from the voltages of the Battery Pack A 302 and the Variable Power Supply (VPS1) 306. If the Total Series Voltage (TSV) 310 is set higher than the voltage of the Battery Pack B 304, current will flow from the Battery Pack A 302 to charge the Battery Pack B 304, as represented by the arrow 312. The Current Limiting Circuit (CL1) 308 maintains the charge current at a constant value so that the Battery Pack A 302 charges the Battery Pack B 304 in the Constant Current (CC) state. In order to protect against over charging the Battery Pack B 304, the Total Series Voltage (TSV) 310 is monitored at regular intervals and where necessary, the Variable Power Supply (VPS1) 306 is adjusted manually to limit the Total Series Voltage (TSV) 310 to the pre-determined permissible maximum voltage of the Battery Pack B 304. Thus, when the Battery Pack B 304 is charged to its pre-determined permissible maximum voltage, the charge current starts to decrease and the Current Limiting Circuit (CL1) 308 acts in a similar fashion to a bypass circuit as the system switches from the Constant Current (CC) state 210 to the Constant Voltage (CV) charging state 212. The charging of the Battery Pack B 304 is stopped when its full charge condition is met.

Figure 4:
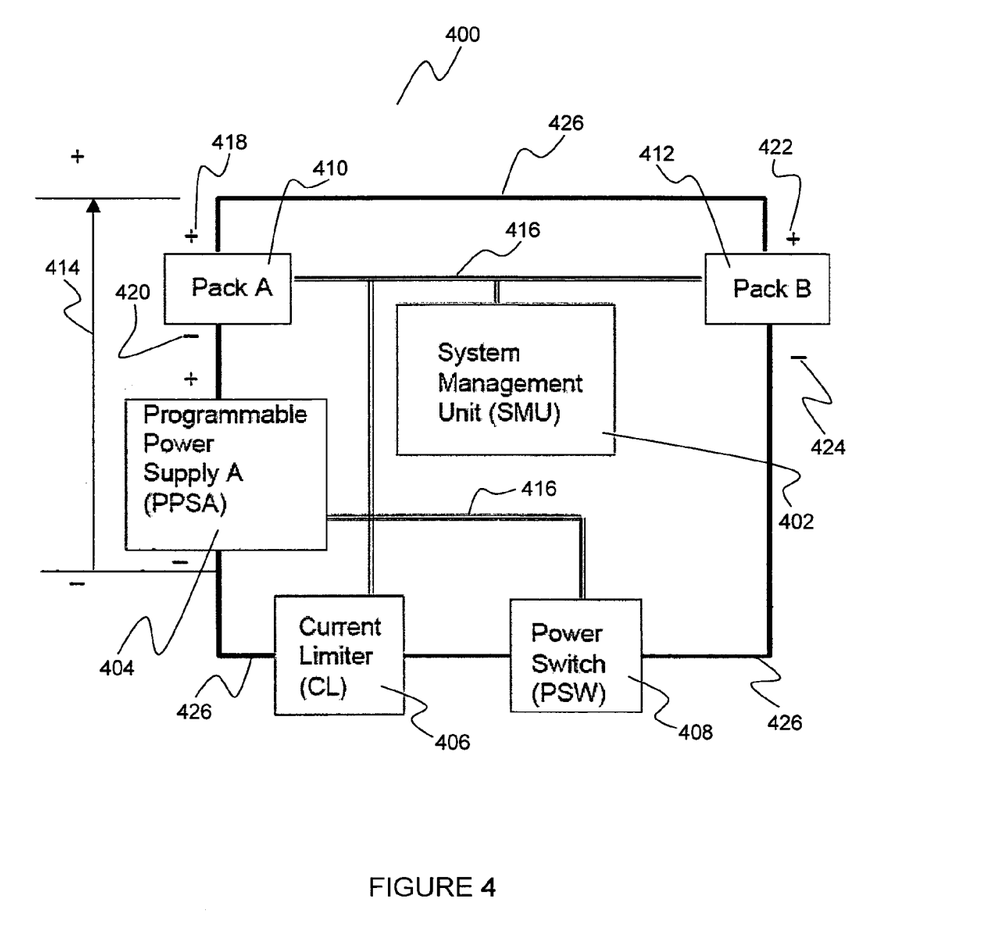
FIG. 4 shows a schematic block diagram illustrating an automatic energy transfer system between two lithium-ion battery packs of an example embodiment.

FIG. 4 shows a schematic block diagram illustrating an automatic energy transfer system 400 between two lithium-ion battery packs of example embodiments. The automatic energy transfer system 400 comprises a System Management Unit (SMU) 402 arranged to control and communicate with a Programmable Power Supply A (PPSA) 404, a Current Limiter (CL) 406, a Power Switch (PSW) 408, a Battery Pack A 410 and a Battery Pack B 412 via a network of System Management Bus (SMBus) connections represented as lines e.g. 416 in order to perform the energy transfer process. It should be appreciated that other communication interface, for example serial, parallel and wireless communication interface, may be employed instead of the SMBus communication interface. The Battery Pack A 410 and the Battery Pack B 412 are connected in parallel while the Programmable Power Supply A (PPSA) 404, the Current Limiter (CL) 406 and the Power Switch (PSW) 408 are connected in series with the Battery Pack A 410 via a closed-loop electrical connection represented as line 426. The process for the energy transfer of the energy transfer system 400 will now be described with reference to the flowchart 500 of FIG. 5. After the start 502 of the energy transfer process, the System Management Unit (SMU) proceeds to communicate with the Battery Pack A and the Battery Pack B at step 504 to check the respective status of the voltage and temperature of the Battery Pack A and the Battery Pack B. At step 506, the voltages and temperatures of the Battery Pack A and the Battery Pack B are checked against pre-determined safety limits to determine if they are within the safe limits for operations. If any of the voltages or temperatures of the Battery Pack A or the Battery Pack B are outside the safe limits, the process proceeds to step 520 to stop and subsequently ends 522 the energy transfer process. In the event that the Battery Pack A is not over-discharged and the Battery Pack B is not fully charged and that the temperatures of both the Battery Pack A and the Battery Pack B are within the safe operating temperature range, the process proceeds to step 508 where the System Management Unit (SMU) turns on the Power Switch (PSW) and subsequently the process continues to step 510 to set the output voltage of the Programmable Power Supply A (PPSA).

Figure 5:
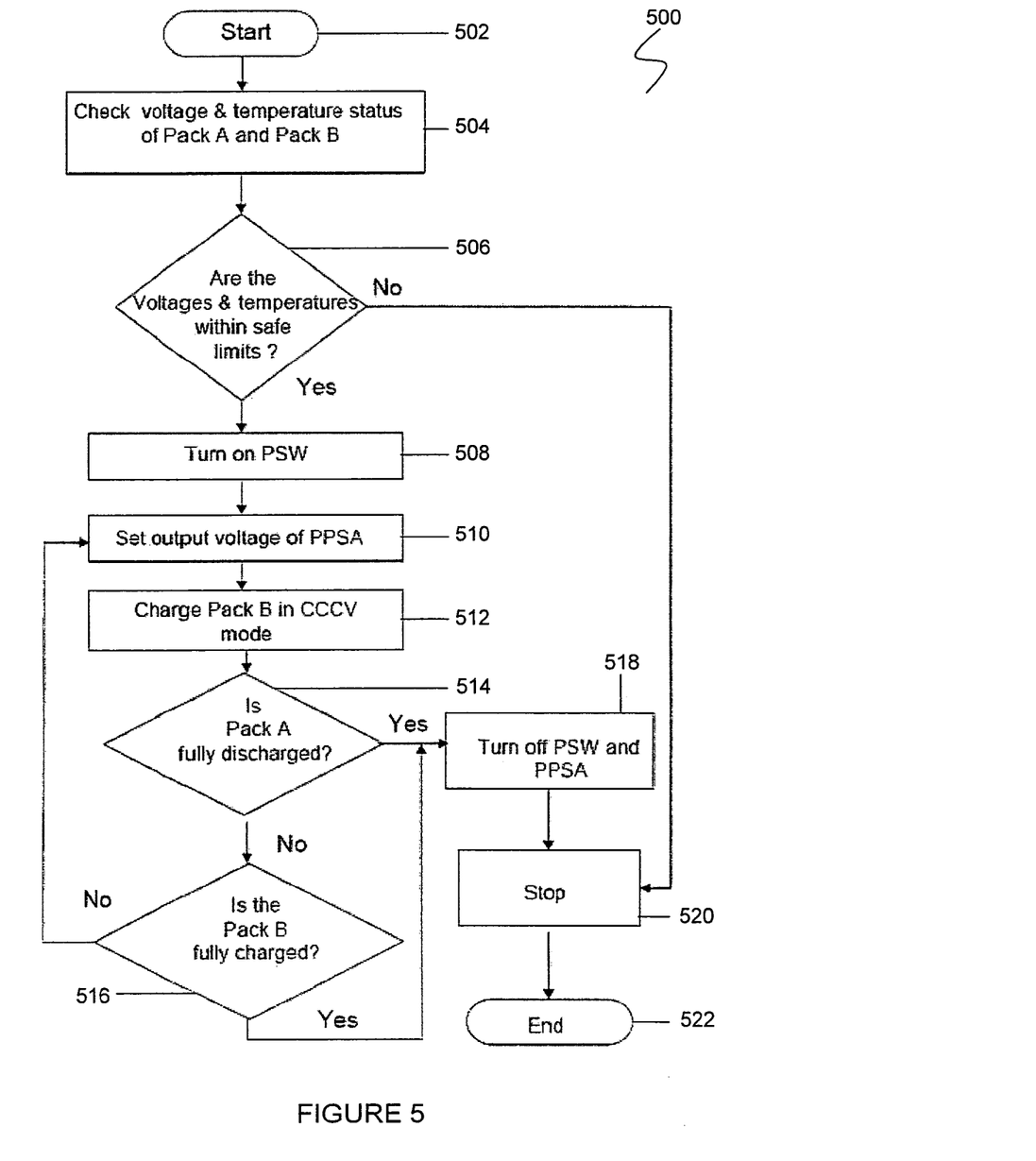
FIG. 5 shows a flowchart illustrating a process of energy transfer for the automatic energy transfer system according to the embodiment of FIG. 4.

In example embodiments, the output voltage of the Programmable Power Supply A (PPSA) may be set based on the conditions as described below, by way of example and not limitation. The Total Series Voltage (TSV), determined collectively from the voltages of the Programmable Power Supply A (PPSA) and the Battery Pack A, is set for example 0.1 V higher than the voltage of the Battery Pack B to enable the energy transfer from the Battery Pack A to the Battery Pack B. If the Battery Pack A has a higher potential than the Battery Pack B, for example above 0.1 V, the Programmable Power Supply A (PPSA) is set to 0 V. The System Management Unit (SMU) then sets the Current Limiter (CL) to maintain a constant charge current to charge the Battery Pack B. Furthermore, the Total Series Voltage (TSV) is not set higher than the pre-determined permissible maximum voltage of the Battery Pack B to protect against over charging the Battery Pack B. Subsequently after the output voltage of the Programmable Power Supply A (PPSA) has been set, the process for the energy transfer proceeds to step 512 where the Battery Pack B is charged in the Constant Current Constant Voltage (CCCV) mode. During the charging step 512, the charge current flows from the positive (+) terminal of the Battery Pack A towards the positive (+) terminal of the Battery Pack B to charge the Battery Pack B. The charge current subsequently flows from of the negative (−) terminal of the Battery Pack B through the Power Switch (PSW), the Current Limiter (CL) and the Programmable Power Supply A (PPSA) towards the negative (−) terminal of the Battery Pack A.

In example embodiments, the System Management Unit (SMU) continuously monitors the respective status of both the Battery Pack A and the Battery Pack B at regular intervals and progressively increases the Programmable Power Supply A (PPSA) output as the voltages of the Battery Pack A and the Battery Pack B decreases and increases respectively in order to maintain a constant charge current so that the Battery Pack B is charging in the Constant Current (CC) state. While the Battery Pack B is charging up to its pre-determined permissible maximum voltage, the charge current decreases progressively as the charging process switches from the Constant Current (CC) state to the Constant Voltage (CV) state. In example embodiments at step 514, the Battery Pack A is checked to determine if it has been fully discharged. In the event that the Battery Pack A has been fully discharged, the energy transfer process is terminated by the sequential process of turning off the Power Switch (PSW) and the Programmable Power Supply A (PPSA) at step 518 and then stopping 520 and ending 522 the energy transfer process. If the Battery Pack A has not been fully discharged, the process proceeds to step 516 where the Battery Pack B is checked to determine if it has been fully charged. In the event that the Battery Pack B has been fully charged, the energy transfer process is terminated by the sequential process of turning off the Power Switch (PSW) and the Programmable Power Supply A (PPSA) at step 518 and then stopping 520 and ending 522 the energy transfer process. If the Battery Pack B has not been fully charged, the process returns to step 510 to reset the output voltage of the Programmable Power Supply A (PPSA). The subsequent steps after step 510 as described above are then repeated until either the Battery Pack A has been fully discharged as determined in step 514 or the Battery Pack B has been fully charged as determined in step 516, whereby the energy transfer process is then terminated. Generally, the energy transfer process does not offer 100% efficiency as the Battery Pack A typically has its entire energy depleted before the Battery Pack B is fully charged.

It will be appreciated that the fully charged Battery Pack B can then be used in the same manner as Battery Pack A to charge another Battery Pack from a discharging of Battery Pack B using the system and method as described with reference to FIGS. 4 and 5. Also, it will be appreciated that the system and method as described with reference to FIGS. 4 and 5 can also be used for the 50% re-charging as part of the overall burn-in test by stopping the charging when 50% re-charging is reached under the control of the System Management Unit.

Figure 6:
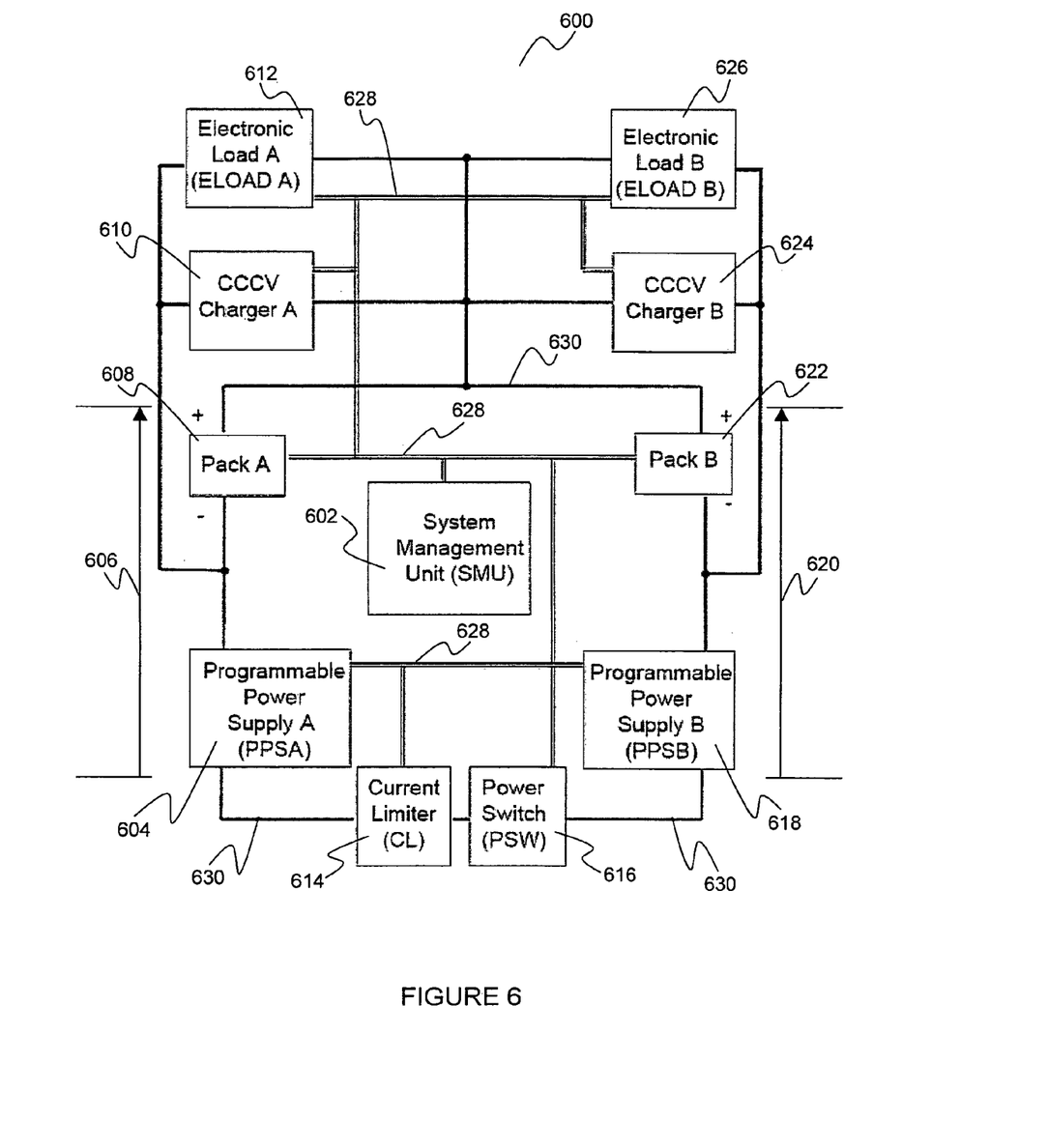
FIG. 6 shows a schematic block diagram illustrating a recyclable energy lithium-ion battery pack's burn-in test system in accordance with one embodiment of the present invention.

FIG. 6 shows a schematic block diagram illustrating a recyclable energy lithium-ion battery pack's burn-in test system 600 in accordance with one embodiment of the present invention. The burn-in test system 600 is a further enhancement to the automatic energy transfer system 400 (FIG. 4) described previously as the system 600 is able to support the process of bi-directional energy transfer and charging and discharging of the Battery Pack A 608 and the Battery Pack B 622 to the desired capacity in example embodiments. The burn-in test system 600 comprises a System Management Unit (SMU) 602 arranged to control and communicate with the different devices of the burn-in test system 600 via a network of System Management Bus (SMBus) connections represented as lines e.g. 628 to perform the energy transfer process. It should be appreciated that other communication interface, for example serial, parallel and wireless communication interface, may be employed instead of the SMBus communication interface. The burn-in test system 600 further comprises a Battery Pack A 608 and a Battery Pack B 622 connected in parallel, thereby allowing the transfer of energy from one battery pack to the other. In example embodiments, a Programmable Power Supply A (PPSA) 604 is connected in series with the Battery Pack A 608 and a Programmable Power Supply B (PPSB) 618 is connected in series with the Battery Pack B 622. The voltage of the Programmable Power Supply A (PPSA) 604 may be set by the System Management Unit (SMU) 602 in order to control the Total Series Voltage A (TSVA) 606 and consequently the energy transfer from the Battery Pack A 608 to the Battery Pack B 622. In a similar fashion, the voltage of the Programmable Power Supply B (PPSB) 618 may be set by the System Management Unit (SMU) 602 in order to control the Total Series Voltage B (TSVB) 620 and consequently the energy transfer from the Battery Pack B 622 to the Battery Pack A 608.

The burn-in test system 600 of example embodiments further comprises a Current Limiter (CL) 614 connected in series with the Programmable Power Supply A (PPSA) 604 and the Battery Pack A 608 in order to control the Constant Current Constant Voltage (CCCV) charging of the Battery Pack A 608 and the Battery Pack B 622 and a Power Switch (PSW) 616 connected in series with the Current Limiter (CL) 614 to protect both the Battery Pack A 608 and the Battery Pack B 622 from over-discharging and over-charging by opening the current path between them. In example embodiments, the Battery Pack A 608, the Battery Pack B 622, the Programmable Power Supply A (PPSA) 604, the Programmable Power Supply B (PPSB) 618, the Current Limiter (CL) 614 and the Power Switch (PSW) 616 are connected to each other via a closed-loop electrical connection represented as line 630.

In example embodiments, the burn-in test system 600 further comprises a Constant Current Constant Voltage (CCCV) Charger A 610 and an Electronic Load A (ELoad A) 612 connected in parallel to the Battery Pack A 608 and a Constant Current Constant Voltage (CCCV) Charger B 624 and an Electronic Load B (ELoad B) 626 connected in parallel to the Battery Pack B 622. The Constant Current Constant Voltage (CCCV) Charger A 610 and the Constant Current Constant Voltage (CCCV) Charger B 624 enable the charging of the Battery Pack A 608 and the Battery Pack B 622 respectively while the Electronic Load A (ELoad A) 612 and the Electronic Load B (ELoad B) 626 enable the discharging of the Battery Pack A 608 and the Battery Pack B 622 respectively to a pre-determined capacity relatively accurately.

Figure 7:
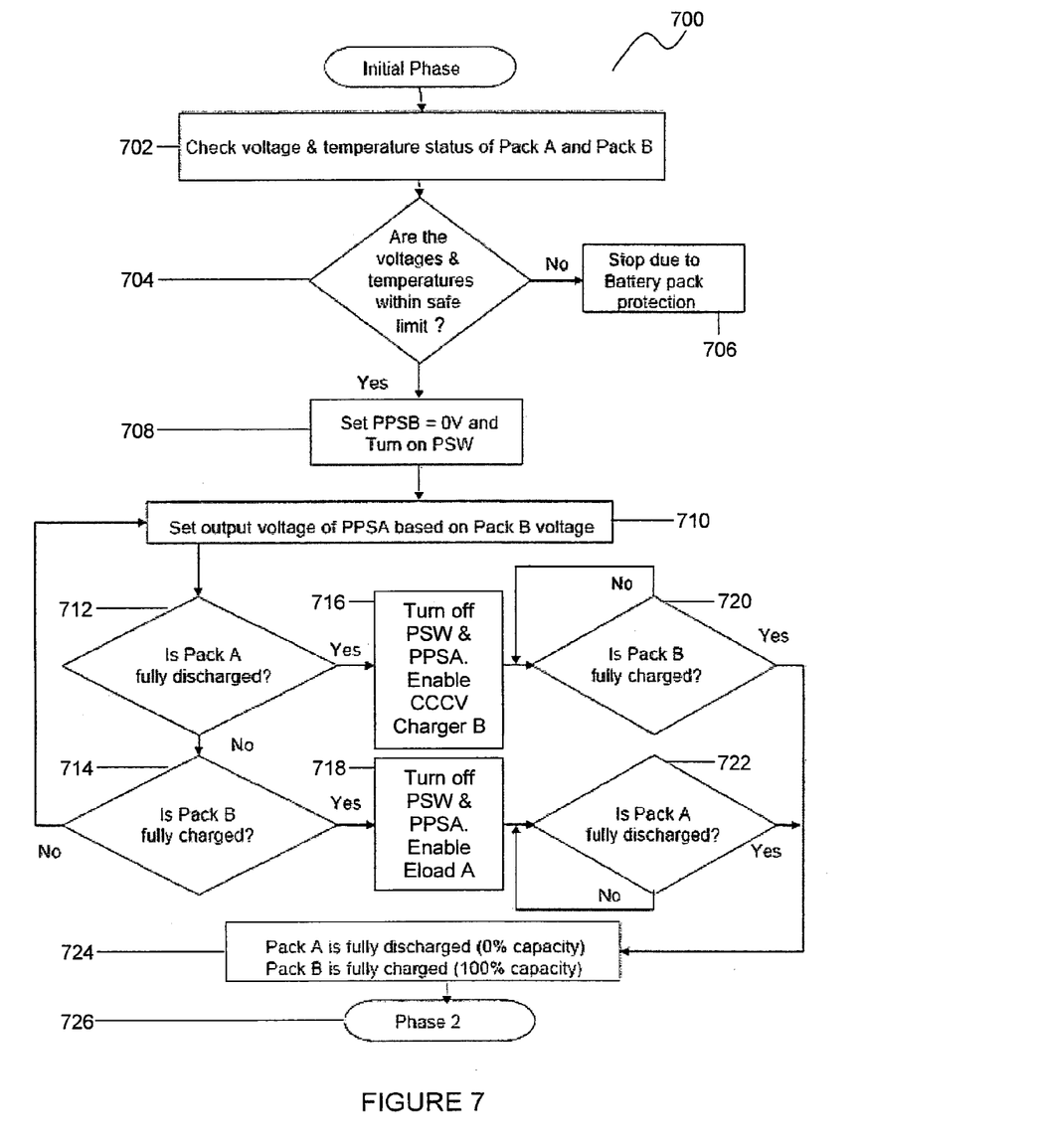
FIG. 7 shows a flowchart illustrating the initial phase of the energy transfer process for the recyclable energy lithium-ion battery pack's burn-in test system according to the embodiment of FIG. 6.

The energy transfer process of the system 600 will now be described with reference to the flowcharts of FIGS. 7-9. FIG. 7 shows a flowchart 700 illustrating an initial phase of the energy transfer process for the recyclable energy lithium-ion battery pack's burn-in test system of example embodiments, for example the burn-in test system 600. During the initial phase, the energy transfer process involves transferring energy from the Battery Pack A to the Battery Pack B. At step 702, the System Management Unit (SMU) proceeds to communicate with the Battery Pack A and the Battery Pack B to check the respective status of the voltage and temperature of the Battery Pack A and the Battery Pack B. At step 704, the voltages and temperatures of the Battery Pack A and the Battery Pack B are checked against pre-determined safety limits to determine if they are within the safe limits for operations. If any of the voltages or temperatures of the Battery Pack A or the Battery Pack B are outside the safe limits, the process stops at step 706 as a result of the protection features incorporated into the battery packs in example embodiments.

In the event that the Battery Pack A is not over-discharged and the Battery Pack B is not fully charged and that the temperatures of both the Battery Pack A and the Battery Pack B are within the safe operating temperature range, the process proceeds to step 708 where the System Management Unit (SMU) sets the Programmable Power Supply B (PPSB) to 0 V to act as a bypass to allow current to flow and turns on the Power Switch (PSW). The System Management Unit (SMU) then sets the output voltage of the Programmable Power Supply A (PPSA) at step 710 such that the Total Series Voltage A (TSVA), determined collectively from the voltages of the Programmable Power Supply A (PPSA) and the Battery Pack A, is set for example 0.1 V higher than the voltage of the Battery Pack B to enable the energy transfer from the Battery Pack A to the Battery Pack B. If the Battery Pack A has a higher potential than the Battery Pack B, for example above 0.1V, the Programmable Power Supply A (PPSA) is set to 0 V. The System Management Unit (SMU) then sets the Current Limiter (CL) to maintain a constant charge current to charge the Battery Pack B. Furthermore, the Total Series Voltage A (TSVA) is not set higher than the pre-determined permissible maximum voltage of the Battery Pack B to protect against over charging the Battery Pack B.

In example embodiments, the System Management Unit (SMU) continuously monitors the respective status of both the Battery Pack A and the Battery Pack B at regular intervals and progressively increases the Programmable Power Supply A (PPSA) output as the voltages of the Battery Pack A and the Battery Pack B decreases and increases respectively in order to maintain a constant charge current so that the Battery Pack B is charging in the Constant Current (CC) state. While the Battery Pack B is charging up to its pre-determined permissible maximum voltage, the charge current decreases progressively as the charging process switches from the Constant Current (CC) state to the Constant Voltage (CV) state.

Generally, the energy transfer process does not offer 100% efficiency as the Battery Pack A typically has its entire energy depleted before the Battery Pack B is fully charged. At step 712, the Battery Pack A is checked to determine if it has been fully discharged. In the event that the Battery Pack A has depleted its energy (i.e. fully discharged) before the Battery Pack B has been fully charged, as determined in step 712, the process proceeds to step 716 where the System Management Unit (SMU) turns off the Programmable Power Supply A (PPSA) and the Power Switch (PSW) to stop the charging of the Battery Pack B. Subsequently, the System Management Unit (SMU) enables the CCCV Charger B to continue the charging of the Battery Pack B. At step 720, the Battery Pack B is checked to determine if it has been fully charged. If the Battery Pack B has not been fully charged, the CCCV Charger B continues the charging of the Battery Pack B. In the event that the Battery Pack B has been fully charged, the charging process is terminated at step 724 where at the end of this initial phase of the energy transfer process, the Battery Pack A is fully discharged (0% capacity) while the Battery Pack B is fully charged (100% capacity). Subsequently, the energy transfer process proceeds to phase 2 at step 726.

In example embodiments, in the event that the Battery Pack A has not depleted its energy (i.e. not fully discharged), as determined in step 712, the process proceeds to step 714 where the Battery Pack B is checked to determine if it has been fully charged. If the Battery Pack B has been fully charged, as determined in step 714, the process proceeds to step 718 where the System Management Unit (SMU) turns off the Programmable Power Supply A (PPSA) and the Power Switch (PSW) to stop the charging of the Battery Pack B. Subsequently, the System Management Unit (SMU) enables the Electronic Load A (ELoad A) to start the discharging of the Battery Pack A. At step 722, the Battery Pack A is checked to determine if it has been fully discharged. If the Battery Pack A has not been fully discharged, the Electronic Load A (ELoad A) continues the discharging of the Battery Pack A. In the event that the Battery Pack A has been fully discharged, the discharging process is terminated at step 724 where at the end of this initial phase of the energy transfer process, the Battery Pack A is fully discharged (0% capacity) while the Battery Pack B is fully charged (100% capacity). Subsequently, the energy transfer process proceeds to phase 2 at step 726. In the event that the Battery Pack B has not been fully charged, as determined at step 714, the process returns to step 710 to reset the output voltage of the Programmable Power Supply A (PPSA) and the subsequent steps after step 710 are then repeated until the Battery Pack A has been fully discharged (0% capacity) and the Battery Pack B has been fully charged (100% capacity) at step 724.

Figure 8:
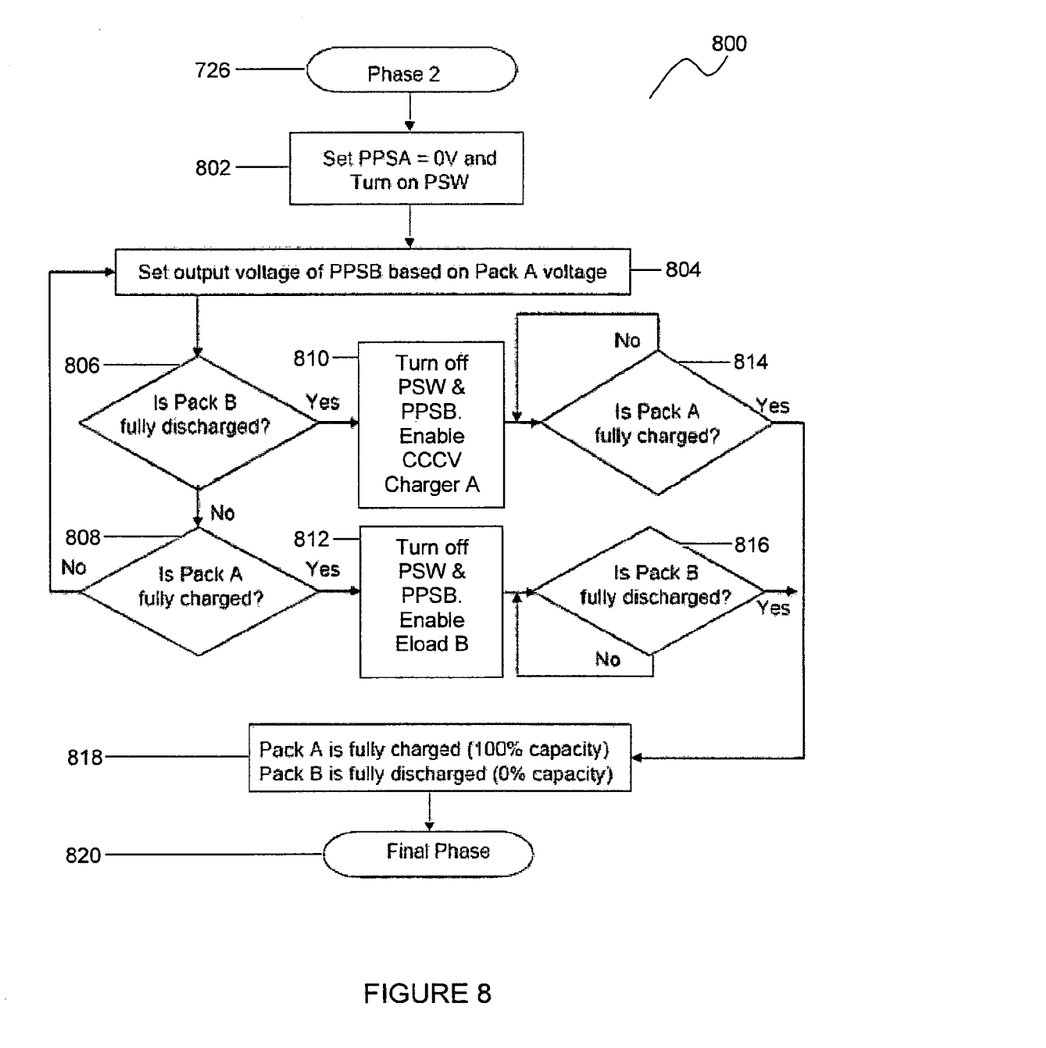
FIG. 8 shows a flowchart illustrating phase 2 of the energy transfer process for the recyclable energy lithium-ion battery pack's burn-in test system according to the embodiment of FIG. 6.

FIG. 8 shows a flowchart 800 illustrating phase 2 of the energy transfer process according to embodiments of the present invention. During phase 2, the energy transfer process involves transferring energy from the Battery Pack B to the Battery Pack A. At step 802, the System Management Unit (SMU) sets the Programmable Power Supply A (PPSA) to 0 V to act as a bypass to allow current to flow and turns on the Power Switch (PSW). The System Management Unit (SMU) then sets the output voltage of the Programmable Power Supply B (PPSB) at step 804 such that the Total Series Voltage B (TSVB), determined collectively from the voltages of the Programmable Power Supply B (PPSB) and the Battery Pack B, is set for example 0.1 V higher than the voltage of the Battery Pack A to enable the energy transfer from the Battery Pack B to the Battery Pack A. If the Battery Pack B has a higher potential than the Battery Pack A, for example above 0.1 V, the Programmable Power Supply B (PPSB) is set to 0 V. The System Management Unit (SMU) then sets the Current Limiter (CL) to maintain a constant charge current to charge the Battery Pack A. Furthermore, the Total Series Voltage B (TSVB) is not set higher than the pre-determined permissible maximum voltage of the Battery Pack A to protect against over charging the Battery Pack A.

In example embodiments, the System Management Unit (SMU) continuously monitors the respective status of both the Battery Pack A and the Battery Pack B at regular intervals and progressively increases the Programmable Power Supply B (PPSB) output as the voltages of the Battery Pack B and the Battery Pack A decreases and increases respectively in order to maintain a constant charge current so that the Battery Pack A is charging in the Constant Current (CC) state. While the Battery Pack A is charging up to its pre-determined permissible maximum voltage, the charge current decreases progressively as the charging process switches from the Constant Current (CC) state to the Constant Voltage (CV) state.

Generally, the energy transfer process does not offer 100% efficiency as the Battery Pack B typically has its entire energy depleted before the Battery Pack A is fully charged. At step 806, the Battery Pack B is checked to determine if it has been fully discharged. In the event that the Battery Pack B has depleted its energy (i.e. fully discharged) before Battery Pack A has been fully charged, as determined in step 806, the process proceeds to step 810 where the System Management Unit (SMU) turns off the Programmable Power Supply B (PPSB) and the Power Switch (PSW) to stop the charging of the Battery Pack A. Subsequently, the System Management Unit (SMU) enables the CCCV Charger A to continue the charging of the Battery Pack A. At step 814, the Battery Pack A is checked to determine if it has been fully charged. If the Battery Pack A has not been fully charged, the CCCV Charger A continues the charging of the Battery Pack A. In the event that the Battery Pack A has been fully charged, the charging process is terminated at step 818 where at the end of phase 2 of the energy transfer process, the Battery Pack A is fully charged (100% capacity) while the Battery Pack B is fully discharged (0% capacity). Subsequently, the energy transfer process proceeds to the final phase at step 820.

In example embodiments, in the event that the Battery Pack B has not depleted its energy (i.e. not fully discharged), as determined in step 806, the process proceeds to step 808 where the Battery Pack A is checked to determine if it has been fully charged. If the Battery Pack A has been fully charged, as determined in step 808, the process proceeds to step 812 where the System Management Unit (SMU) turns off the Programmable Power Supply B (PPSB) and the Power Switch (PSW) to stop the charging of the Battery Pack A. Subsequently, the System Management Unit (SMU) enables the Electronic Load B (ELoad B) to start the discharging of the Battery Pack B. At step 816, the Battery Pack B is checked to determine if it has been fully discharged. If the Battery Pack B has not been fully discharged, the Electronic Load B (ELoad B) continues the discharging of the Battery Pack B. In the event that the Battery Pack B has been fully discharged, the discharging process is terminated at step 818 where at the end of this phase 2 of the energy transfer process, the Battery Pack A is fully charged (100% capacity) while the Battery Pack B is fully discharged (0% capacity). Subsequently, the energy transfer process proceeds to the final phase at step 820. In the event that the Battery Pack A has not been fully charged, as determined at step 808, the process returns to step 804 to reset the output voltage of the Programmable Power Supply B (PPSB) and the subsequent steps after step 804 are then repeated until the Battery Pack A has been fully charged (100% capacity) and the Battery Pack B has been fully discharged (0% capacity) at step 818.

Figure 9:
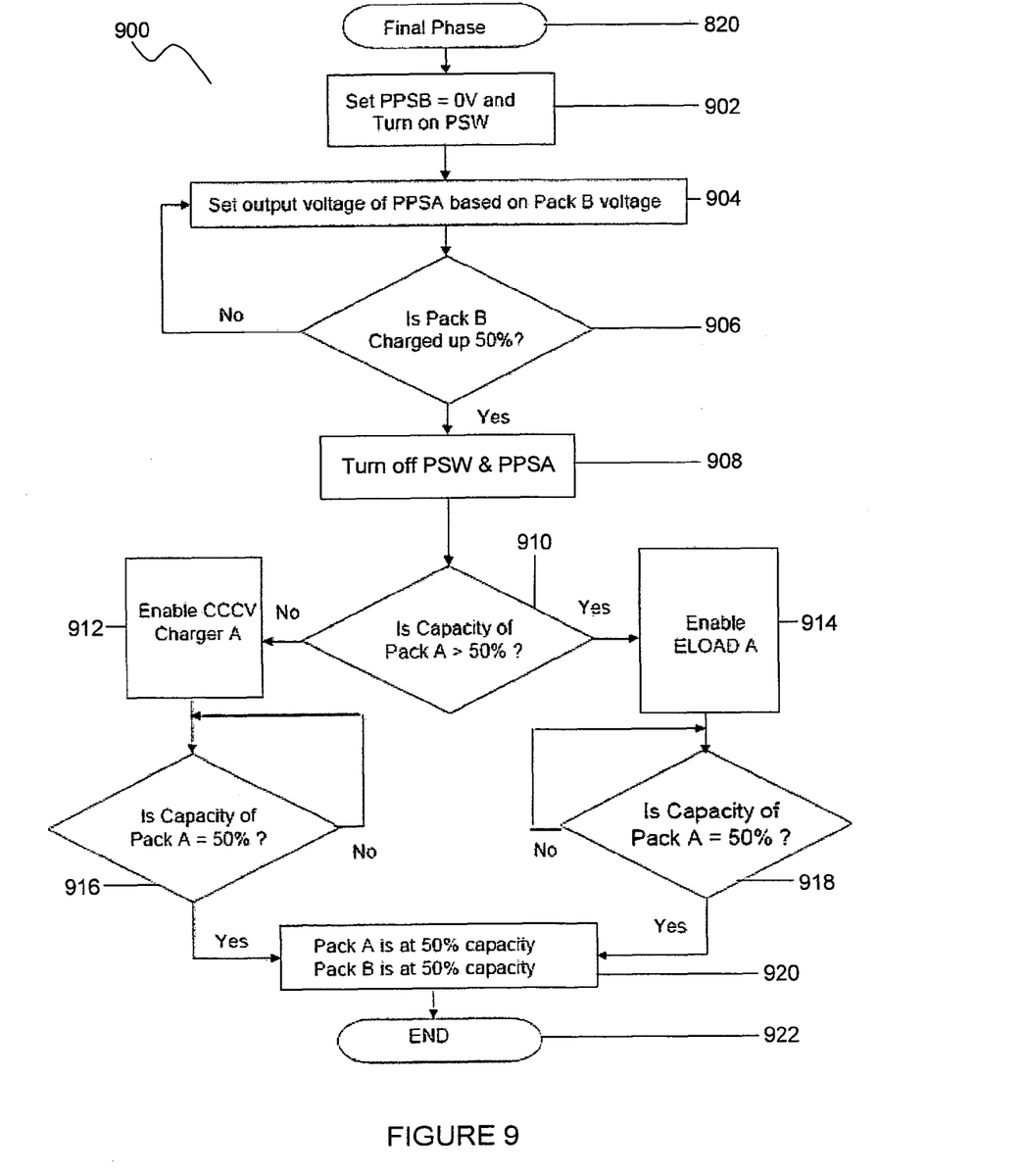
FIG. 9 shows a flowchart illustrating the final phase of the energy transfer process for the recyclable energy lithium-ion battery pack's burn-in test system according to the embodiment of FIG. 6.

FIG. 9 shows a flowchart 900 illustrating the final phase of the energy transfer process according to embodiments of the present invention. During the final phase, the energy transfer process involves transferring energy from the Battery Pack A to the Battery Pack B. At step 902, the System Management Unit (SMU) sets the Programmable Power Supply B (PPSB) to 0 V to act as a bypass to allow current to flow and turns on the Power Switch (PSW). The System Management Unit (SMU) then sets the output voltage of the Programmable Power Supply A (PPSA) at step 904 such that the Total Series Voltage A (TSVA), determined collectively from the voltages of the Programmable Power Supply A (PPSA) and the Battery Pack A is set for example 0.1 V higher than the voltage of the Battery Pack B to enable the energy transfer from the Battery Pack A to the Battery Pack B. If the Battery Pack A has a higher potential than the Battery Pack B, for example above 0.1 V, the Programmable Power Supply A (PPSA) is set to 0 V. The System Management Unit (SMU) then sets the Current Limiter (CL) to maintain a constant charge current to charge the Battery Pack B. Furthermore, the Total Series Voltage A (TSVA) is not set higher than the pre-determined permissible maximum voltage of the Battery Pack B to protect against the over charging of Battery Pack B.

In example embodiments, the System Management Unit (SMU) continuously monitors the respective status of both the Battery Pack A and the Battery Pack B at regular intervals and progressively increases the Programmable Power Supply A (PPSA) output as the voltages of the Battery Pack A and the Battery Pack B decreases and increases respectively in order to maintain a constant charge current so that the Battery Pack B is charging in the Constant Current (CC) state. At step 906, the Battery Pack B is checked to determine if it has been charged to 50% capacity. If the Battery Pack B has not been charged to 50% capacity, the process returns to step 904 in order to reset the output voltage of the Programmable Power Supply A (PPSA) to continue the charging of the Battery Pack B until a 50% capacity has been achieved. In the event that the Battery Pack B has been charged to 50% capacity, as determined in step 906, the process proceeds to step 908 where the System Management Unit (SMU) turns off the Programmable Power Supply A (PPSA) and the Power Switch (PSW) to stop the charging of the Battery Pack B.

In example embodiments, the process subsequently proceeds to step 910 where the Battery Pack A is checked to determine if it is at more than 50% capacity. If the capacity of the Battery Pack A is less than 50%, as determined in step 910, the process proceeds to step 912 where the System Management Unit (SMU) enables the CCCV Charger A to start the charging of the Battery Pack A. At step 916, the Battery Pack A is checked to determine if it has been charged to 50% capacity. If the Battery Pack A has not been charged to 50% capacity, the CCCV Charger A continues the charging of the Battery Pack A. In the event that the Battery Pack A has been charged to 50% capacity, the charging process is terminated at step 920 where at the end of this final phase of the energy transfer process, both the Battery Pack A and the Battery Pack B are at 50% capacity charge. Subsequently, the energy transfer process ends at step 922.

In the event that the capacity of the Battery Pack A is more than 50%, as determined in step 910, the process proceeds to step 914 where the System Management Unit (SMU) enables the Electronic Load A (ELOAD A) to start the discharging of the Battery Pack A. At step 918, the Battery Pack A is checked to determine if it has been discharged to 50% capacity. If the Battery Pack A has not been discharged to 50% capacity, the Electronic Load A (ELOAD A) continues the discharging of the Battery Pack A. In the event that the Battery Pack A has been discharged to 50% capacity, the charging process is terminated at step 920 where at the end of this final phase of the energy transfer process, both the Battery Pack A and the Battery Pack B are at 50% capacity charge. Subsequently, the energy transfer process ends at step 922.

The lithium-ion battery pack's burn-in test system according to embodiments of the present invention can allow two battery packs to be tested at the same time. The test system enables the transfer of electrical energy or charges from one battery pack to the other battery pack and vice versa. In example embodiments, the energy transfer process utilises the electrical energy discharged from one battery pack which is in the discharging state to charge another battery pack which is in the charging state. This energy transfer process is able to transfer energy regardless of the electrical potential difference between the battery packs and it is able to recharge the lithium-ion battery packs in the Constant Current Constant Voltage mode.

The lithium-ion battery pack's burn-in test system according to embodiments of the present invention can advantageously minimise the generation of heat as waste from the series of tests and charging and discharging of the battery packs. Conventional burn-in test processes generate a large amount of heat as the battery packs transfer their electrical energy with chargers and loads by charging from the chargers and discharging to the loads connected to the battery packs. In contrast, the burn-in test system of example embodiments employs an energy transfer process which exchanges electrical energy between the battery packs. In the event that a battery pack has not been charged to the desired capacity from the energy transfer process, a Constant Current Constant Voltage (CCCV) charger is activated to continue the charging of the battery pack to the desired capacity. In the event that a battery pack has not been discharged to the desired capacity from the energy transfer process, an Electronic Load (Eload) is activated to continue the discharging of the battery pack to the desired capacity. The selective use of the Constant Current Constant Voltage (CCCV) charger and the Electronic Load (Eload) to charge and discharge the battery pack respectively after the energy transfer process between two battery packs helps to reduce the overall heat generated from the battery packs.

The lithium-ion battery pack's burn-in test system according to embodiments of the present invention can allow the testing, state of charge (SOC) calibration and charging of the battery packs simultaneously. The system enables the battery packs to be charged and discharged as a form of burn-in testing to ensure that the battery packs are not faulty due to component defects, mismatched cells, poor spot-welding, poor solder joint and other functional defects, for example. The testing is performed over a three-phase cycle as described above involving full charging, full discharging and charging to 50% capacity for the battery packs. At the same time, the battery pack can also perform a SOC calibration to accurately update its SOC during the full charging-full discharging cycle. At the end of this cycle, the battery packs are typically maintained at 50% capacity charge, which is the general capacity for battery packs prior to shipment of the battery packs to consumers.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

What is claimed is:

1. A battery pack burn-in test system comprising:
   first and second interconnection circuits for electrically interconnecting a first and a second battery pack respectively to the system;
   a data communication bus for coupling to respective battery management integrated circuits (ICs) of the first and second battery packs; and
   a system management unit coupled to the data communication bus;
   wherein the system management unit controls a charging of the first battery pack during a burn-in test from a discharging of the second battery pack;
   and further comprising a first adjustable power supply electrically connected in series with the second electrical interconnection circuit and coupled to the data communication bus for maintaining a selected voltage difference between a series voltage of the second battery pack and the first adjustable power supply on the one hand, and a voltage of the first battery pack on the other hand such as to maintain a constant charging current for the first battery pack in a constant current charging state under the control of the system management unit; and
   wherein the system management unit is further configured for maintaining the series voltage of the second battery pack and the first adjustable power supply at a constant value and allows the charging current to gradually decrease in a constant voltage charging state following the constant current charging state.

2. The system according to claim 1, further comprising a current limiter coupled to the data communication bus, the current limiter being electrically connected between the first and second battery pack to limit a charging current for charging the first battery pack from the discharging of the second pack for an initial charging of the first battery pack in a constant current charging state under the control of the system management unit.

3. The system according to claim 1; further comprising:
   a second adjustable power supply electrically connected in series with the first electrical interconnection circuit and coupled to the data communication bus for maintaining a selected voltage difference between a series voltage of the first battery pack and the second adjustable power supply on the one hand, and a voltage of the second battery pack on the other hand under the control of the system management unit during a constant current charging state of the second battery pack from a discharging of the first battery pack; and wherein the system management unit further maintains the series voltage of the first battery pack and the second adjustable power supply at a constant value and allows the charging current to gradually decrease in a constant voltage charging state of the second battery pack following the constant current charging state of the second battery pack.

4. The system according to claim 3; further comprising first and second chargers electrically connected in parallel with the first and second interconnections respectively and coupled to the data communication bus, for auxiliary charging of the first and second battery packs under the control of the system management unit.

5. The system according to claim 3; further comprising first and second electronic loads electrically connected in parallel with the first and second interconnection circuits respectively and coupled to the data communication bus, for auxiliary discharging of the first and second battery packs under the control of the system management unit.

6. The system according to claim 4, further comprising a power switch electrically connected in series between the first and second interconnection circuits and coupled to the data communication bus, for disconnecting a series connection between the first and second battery packs during the auxiliary charging or discharging.

7. The system according to claim 1, wherein the system management unit determines potential differences and temperatures of the first and the second battery packs respectively.

8. The system according to claim 1, wherein the system management unit determines charge capacities of the first and the second battery packs respectively.

9. The test system according to claim 1, wherein the system management unit comprises a microcontroller.

10. The test system according to claim 1, wherein the data communication bus comprises a SMBus.

11. A method for burn-in testing of battery packs, the method comprising charging a first battery pack from a discharging of a second battery pack and using a first adjustable power supply for maintaining a selected voltage difference between a series voltage of the second battery pack and the first adjustable power supply on the one hand, and a voltage of the first battery pack on the other hand, such as to maintain a constant charging current for the first battery pack in a constant current charging state under the control of the system management unit and maintaining the series voltage of the second battery pack and the first adjustable power supply at a constant value and allowing the charging current to gradually decrease in a constant voltage charging state following the constant current charging state.

12. The method according to claim 11, further comprising limiting a charging current for charging the first battery pack from the discharging of the second pack for an initial charging of the first battery pack in a constant current charging state.

13. The system according to claim 1, wherein the selected voltage difference between the series voltage of the second battery pack and the first adjustable power supply on the one hand, and the voltage of the first battery pack on the other hand is set to 0.1V.

14. The method according to claim 11, wherein the selected voltage difference between a series voltage of the second battery pack and the first adjustable power supply on the one hand, and a voltage of the first battery pack on the other hand is 0.1 V.

* * * * *

UNITED STATES PATENT AND TRADEMARK OFFICE
CERTIFICATE OF CORRECTION

| | | |
|---|---|---|
| PATENT NO. | : 8,487,581 B2 | Page 1 of 1 |
| APPLICATION NO. | : 13/063503 | |
| DATED | : July 16, 2013 | |
| INVENTOR(S) | : Tan et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 330 days.

Signed and Sealed this
First Day of March, 2016

Michelle K. Lee
*Director of the United States Patent and Trademark Office*